(12) United States Patent
Nishikawa

(10) Patent No.: US 9,589,821 B2
(45) Date of Patent: Mar. 7, 2017

(54) ARTICLE TRANSPORT FACILITY AND MAINTENANCE OPERATION METHOD OF ARTICLE TRANSPORT FACILITY

(71) Applicant: Daifuku Co., Ltd., Osaka-shi (JP)

(72) Inventor: Tadashi Nishikawa, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/090,813

(22) Filed: Apr. 5, 2016

(65) Prior Publication Data

US 2016/0297613 A1 Oct. 13, 2016

(30) Foreign Application Priority Data

Apr. 9, 2015 (JP) ................... 2015-080135

(51) Int. Cl.
*H01L 21/677* (2006.01)
*G05B 15/02* (2006.01)

(52) U.S. Cl.
CPC ........ *H01L 21/67733* (2013.01); *G05B 15/02* (2013.01); *H01L 21/67736* (2013.01); *B65G 2201/0297* (2013.01)

(58) Field of Classification Search
CPC .................... H01L 21/67736; H01L 21/67733
See application file for complete search history.

(56) References Cited

U.S. PATENT DOCUMENTS

| 6,092,678 A * | 7/2000 | Kawano ............ H01L 21/67733 212/286 |
| 7,780,020 B2 * | 8/2010 | Yoshitaka .............. B65G 37/02 212/332 |
| 9,004,840 B2 * | 4/2015 | Kinugawa ......... H01L 21/67733 414/281 |
| 9,086,697 B2 * | 7/2015 | Suzuki ............. H01L 21/67276 |
| 9,263,311 B2 * | 2/2016 | Ota ...................... B65G 1/0457 |
| 2016/0111310 A1 * | 4/2016 | Koike ............... H01L 21/67784 414/217 |
| 2016/0240417 A1 * | 8/2016 | Tomida ................. B66C 15/045 |
| 2016/0276194 A1 * | 9/2016 | Wang ................ H01L 21/67766 |

FOREIGN PATENT DOCUMENTS

JP 2005170544 A 6/2005

* cited by examiner

*Primary Examiner* — Thomas Randazzo
(74) *Attorney, Agent, or Firm* — The Webb Law Firm

(57) ABSTRACT

A supporting portion of an article transport device supports a position detection device for detecting the position of a detection target object. A control device executes an update control to update target position information in accordance with an update instruction issued through a manual operation performed by an operator during a maintenance operation performed at an interval longer than a set period, and executes the update control on condition that an elapsed time since issuance of the update instruction has reached an automatic updating time that is a time shorter than the set period.

6 Claims, 10 Drawing Sheets

Fig.3
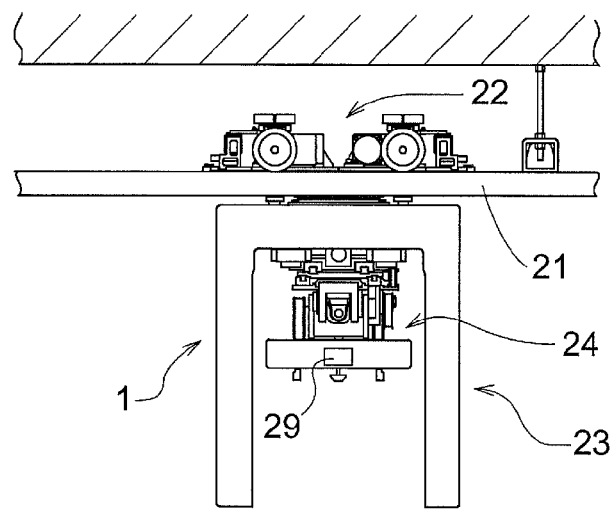
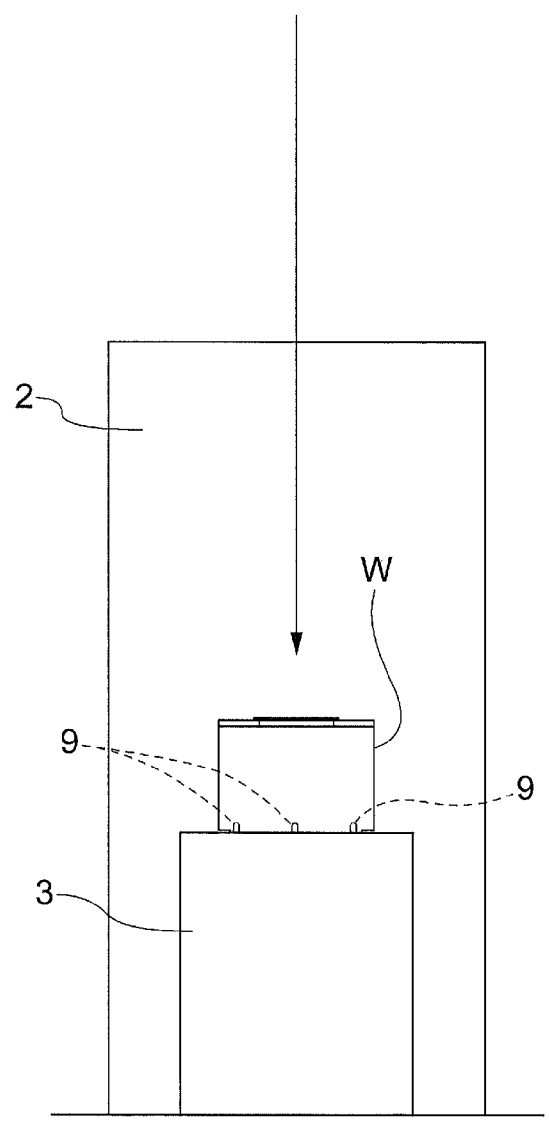

ARTICLE TRANSPORT FACILITY AND MAINTENANCE OPERATION METHOD OF ARTICLE TRANSPORT FACILITY

CROSS-REFERENCE TO RELATED APPLICATION

This application claims priority to Japanese Patent Application No. 2015-080135 filed Apr. 9, 2015, the disclosure of which is hereby incorporated in its entirety by reference.

FIELD OF THE INVENTION

The present invention relates to an article transport facility and a maintenance operation method of an article transport facility.

BACKGROUND

As an example of article transport facilities, a facility is used that includes an article transport device that transports an article to a transport target location and a control device that controls the operation of the article transport device, wherein the article transport device includes a traveling portion that travels along a traveling path, a supporting portion that is supported by the traveling portion and suspends and supports the article, an elevation driving portion that raises and lowers the supporting portion relative to the traveling portion in a state in which the traveling portion is stopped, and a storage portion that stores position information for stopping the traveling portion.

A conventional example of such an article transport facility and a maintenance operation method thereof is described in JP 2005-170544A. In this article transport facility, transporting target position information representing a transporting target position at which the traveling portion is stopped when the article transport device transfers an article to a transport target location is stored in the storage portion. Then, when a transport instruction is issued, the control device that controls the article transport device stops the traveling portion at the transporting target position based on the transporting target position information, and transfers the article to the transport target location.

With the above-described article transport facility, a correction sheet provided with a detection target object is installed in the transport target location, and the position of the detected portion provided in the transport target location is detected by a position detection device supported by the supporting portion in a state in which the traveling portion is stopped at the transporting target position based on the transporting target position information. Then, the control device is configured to update the transporting target position information stored in the storage portion, based on the detection information from the position detection device.

Such an operation of updating the transporting target position information is carried out during a maintenance operation performed periodically, and is performed along with other operations (e.g., manual operations such as adjusting the orientation of the position detection device and replacing traveling wheels provided in the traveling portion) performed by the operator during a maintenance operation.

However, there have been cases where the transporting target position represented by the transporting target position information may be shifted from the ideal transporting target position due to wearing of the traveling wheels even before a maintenance operation is performed. Then, with aging of the article transport device, the shift between the transporting target position represented by the transporting target position information and the ideal transporting target position gradually increases, resulting in cases where the article transport device is unable to properly transfer the article to the transport target location.

For this reason, it is preferable to update the transporting target position information even before a maintenance operation is performed. However, the conventional article transport facility described above requires installation of the correction sheet in the relevant transport target location when updating the transporting target position information. Accordingly, during the operation of updating the transporting target position information, it is not possible to transport an article to the relevant transport target location, leading to a reduction in the article transport efficiency in the article transport facility. Furthermore, if the interval between maintenance operations is shortened, the maintenance operations will be performed with increased frequency, resulting in a greater burden on the operator.

SUMMARY OF THE INVENTION

Therefore, there is a need for an article transport facility and a maintenance operation method of an article transport facility that can suppress a reduction in the article transport efficiency, while avoiding an increase in the operational burden on the operator and updating the transporting target position information at an appropriate time.

An article transport facility includes: an article transport device that transports an article to a transport target location; and a control device that controls operation of the article transport device.

The article transport device includes: a traveling portion that travels along a traveling path; a supporting portion that is supported by the traveling portion and suspends and supports the article; an elevation driving portion that raises and lowers the supporting portion relative to the traveling portion in a state in which the traveling portion is stopped; and a storage portion that stores position information for stopping the traveling portion.

The article transport facility further includes a position detection device for detecting a position of a detection target object provided in a position updating location.

The supporting portion is configured to be capable of supporting the position detection device.

The storage portion stores, as the position information, transporting target position information representing a transporting target position that is a target position at which the traveling portion is stopped when the article transport device transfers the article to the transport target location, and updating target position information representing an updating target position that is a target position at which the traveling portion is stopped when the article transport device detects the detection target object with the position detection device.

The control device is configured to execute a transport control and an update control.

The transport control is a control in which, when a transport instruction to instruct transfer of the article to the transport target location is issued, the traveling portion is stopped at the transporting target position based on the transporting target position information, and while the traveling portion is stopped, the supporting portion is raised or lowered to transfer the article to the transport target location.

The update control is a control in which a position of the detection target object is detected by the position detection device in a state in which the traveling portion is stopped at the updating target position based on the updating target position information, and the updating target position information and the transporting target position information that are stored in the storage portion are updated based on detection information from the position detection device.

The control device is configured to execute the update control in accordance with an update instruction issued through a manual operation performed by an operator during a maintenance operation performed at an interval longer than a set period that is a preset period, and to execute the update control on condition that an elapsed time since issuance of the update instruction has reached an automatic updating time that is a time shorter than the set period.

A maintenance operation method of an article transport facility is a method for performing a maintenance operation of an article transport facility including: an article transport device that transports an article to a transport target location; and a control device that controls operation of the article transport device.

The article transport device including: a traveling portion that travels along a traveling path; a supporting portion that is supported by the traveling portion and suspends and supports the article; an elevation driving portion that raises and lowers the supporting portion relative to the traveling portion in a state in which the traveling portion is stopped; and a storage portion that stores position information for stopping the traveling portion.

The article transport facility further includes a position detection device for detecting a position of a detection target object provided in a position updating location.

The supporting portion is configured to be capable of supporting the position detection device.

The storage portion stores, as the position information, transporting target position information representing a transporting target position that is a target position at which the traveling portion is stopped when the article transport device transfers the article to the transport target location, and updating target position information representing an updating target position that is a target position at which the traveling portion is stopped when the article transport device detects the detection target object with the position detection device.

The control device is configured to execute a transport control and an update control.

The transport control is a control in which, when a transport instruction to instruct transfer of the article to the transport target location is issued, the traveling portion is stopped at the transporting target position based on the transporting target position information, and while the traveling portion is stopped, the supporting portion is raised or lowered to transfer the article to the transport target location.

The update control is a control in which a position of the detection target object is detected by the position detection device in a state in which the traveling portion is stopped at the updating target position based on the updating target position information, and the updating target position information and the transporting target position information that are stored in the storage portion are updated based on detection information from the position detection device.

The control device executes the update control in accordance with an update instruction issued through a manual operation performed by an operator during a maintenance operation performed at an interval longer than a set period that is a preset period, and executes the update control on condition that an elapsed time since issuance of the update instruction has reached an automatic updating time that is a time shorter than the set period.

With these configurations, it is possible to suppress a reduction in the article transport efficiency, while avoiding an increase in the operational burden on the operator and updating the transporting target position information at an appropriate time.

Further features and advantages of the present invention will become apparent from the following description of illustrative and non-limiting embodiments with reference to the drawings.

BRIEF DESCRIPTION OF THE DRAWINGS

FIG. 3 is a side view showing the ceiling guided vehicle and the support platform according to the first embodiment.

DETAILED DESCRIPTION

First Embodiment

Figure 1:
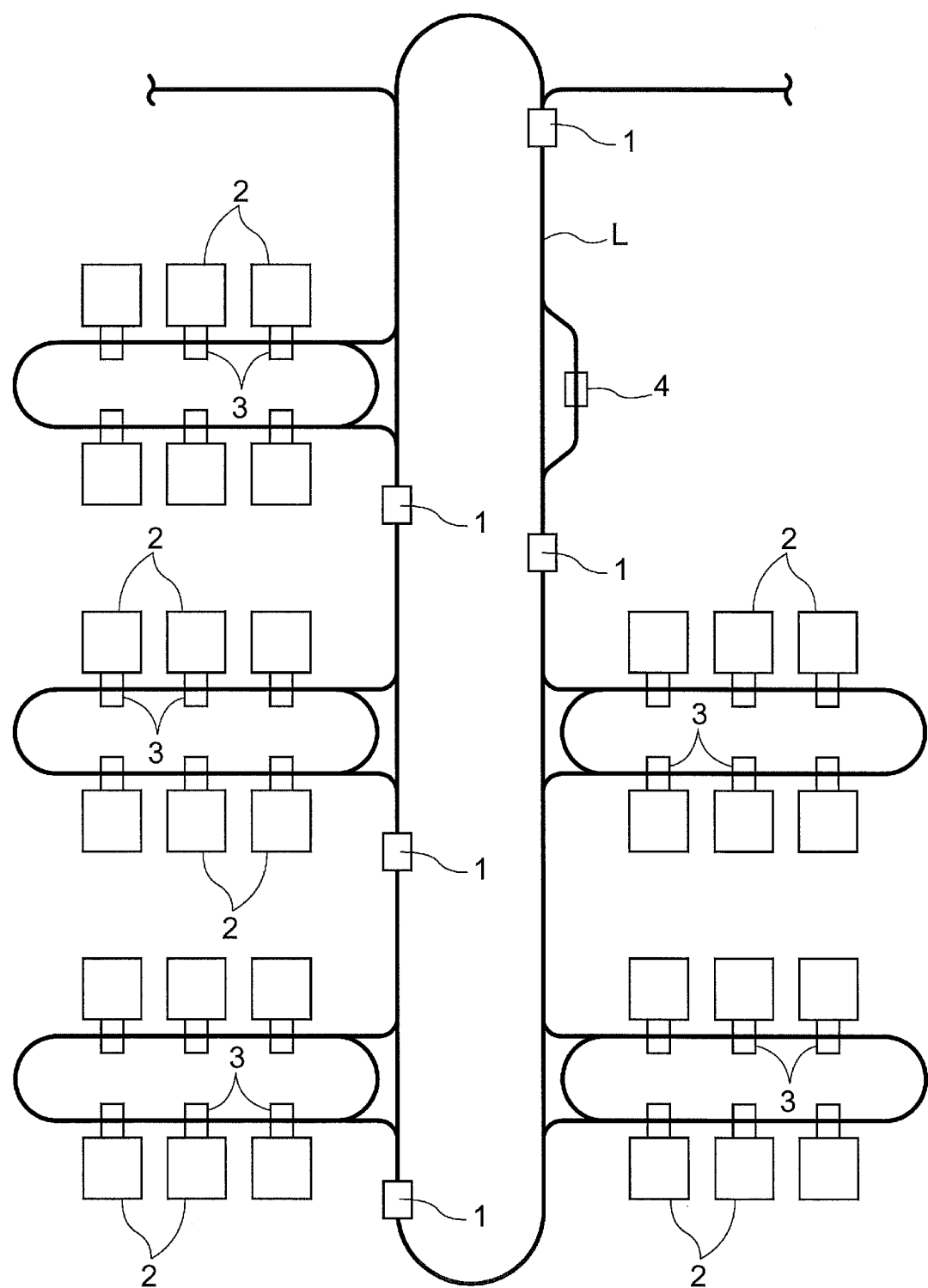
FIG. 1 is a diagram showing a traveling path in an article transport facility according to a first embodiment.

Hereinafter, a first embodiment of an article transport facility will be described with reference to the drawings.

As shown in FIGS. 1 to 4, the article transport facility includes a ceiling guided vehicle 1 that travels in the vicinity of the ceiling along a traveling path L to transport a container W, a processing device 2 that executes processing on substrates accommodated in the container W, a support platform 3 installed on the floor surface so as to be adjacent to the processing device 2, and an inspection platform 4 including a detection target object 12. The article transport facility of the present embodiment includes a plurality of ceiling guided vehicles 1, a plurality of (a number greater than the number of the ceiling guided vehicles 1) processing devices 2, a plurality of (the same number as the number of processing devices 2) support platforms 3, and at least one (a number less than the number of the ceiling guided vehicles 1, e.g., one for each predetermined area) inspection platform 4.

Note that the support platform 3 corresponds to the transport target location, and the inspection platform 4 corresponds to the position updating location. Further, the ceiling guided vehicle 1 corresponds to the article transport device that transports the container W to the support platform 3 as the transport target location. In the present embodiment, a FOUP (Front Opening Unified Pod) that accommodates semiconductor substrates is used as the container W (an exemplary article). In the following description, a direction in which the ceiling guided vehicle 1 travels is referred to as a traveling direction, and a direction orthogonal to the traveling direction in plan view is referred to as a lateral direction.

Container

Figure 5:
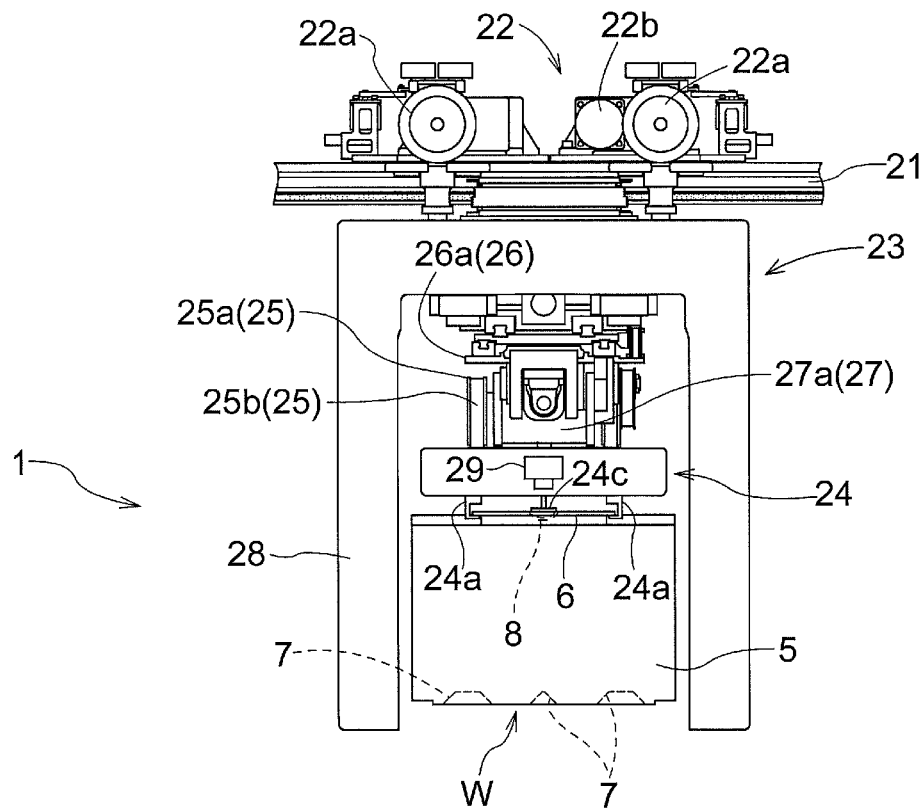
FIG. 5 is a side view showing the ceiling guided vehicle according to the first embodiment.

As shown in FIG. 5, the container W includes a flange portion 6 that is provided at the upper end portion of the container W and is supported by a support mechanism 24 of the ceiling guided vehicle 1, an accommodating portion 5 that is located below the flange portion 6 and accommodates a plurality of semiconductor substrates, and a removable lid member (not shown) that closes a substrate entrance for placing the substrates in and out formed on the front surface of the accommodating portion 5. The ceiling guided vehicle 1 is configured to transport the container W in a state in which the flange portion 6 is suspended and supported thereby.

As shown in FIG. 5, three upwardly recessed, groove-shaped bottom recesses 7 are formed on the bottom surface of the accommodating portion 5 (the bottom surface of the container W). The three bottom recesses 7 are formed such that the longitudinal directions of the bottom recesses 7 extend radially about a bottom surface reference position. Further, each of the three bottom recess 7 is formed in an upwardly tapered shape. Also, the inner surface of the bottom recess 7 is formed as an inclined surface.

Figure 2:
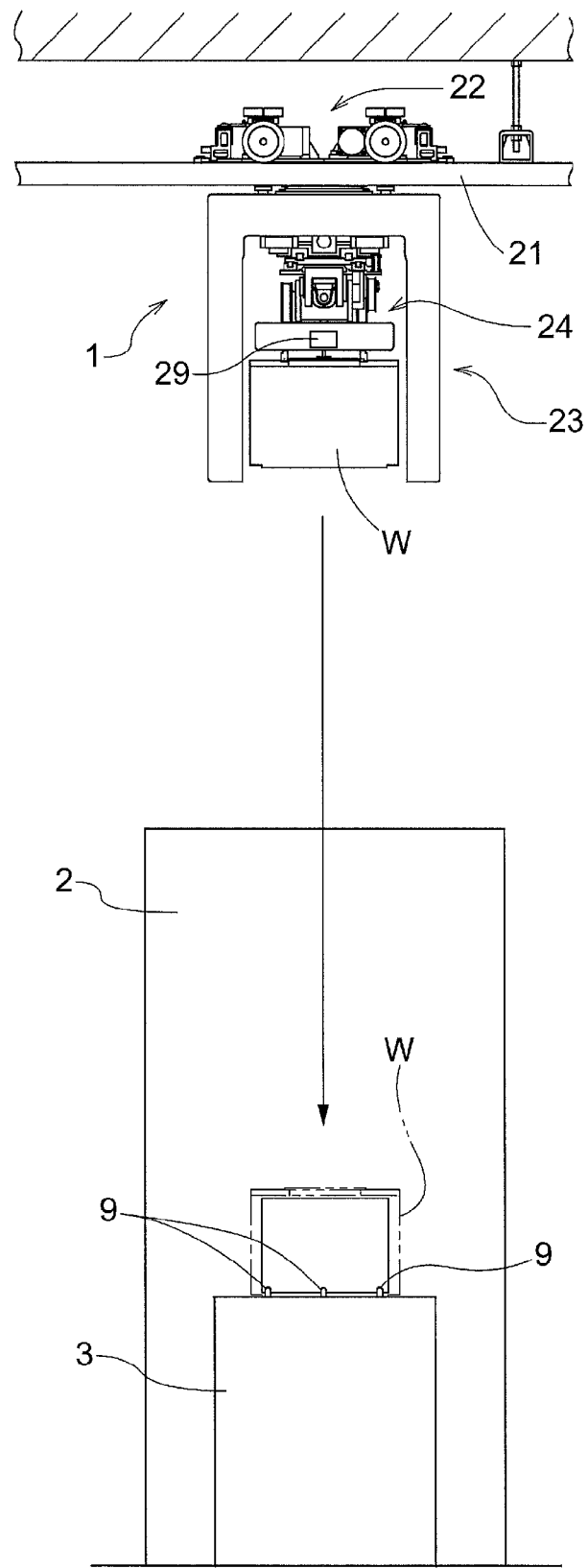
FIG. 2 is a side view showing a ceiling guided vehicle and a support platform according to the first embodiment.
Figure 4:
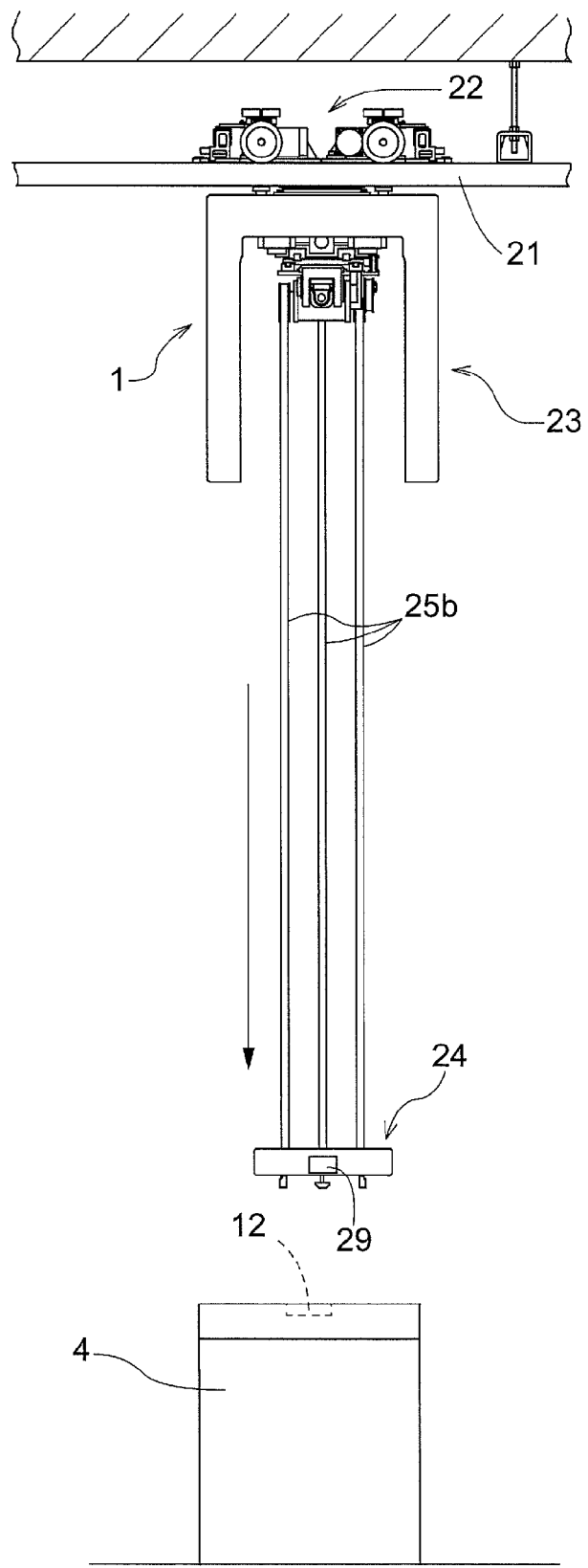
FIG. 4 is a side view showing the ceiling guided vehicle and an inspection platform according to the first embodiment.

The bottom recesses 7 are each provided at a position at which the corresponding positioning member 9 provided on the support platform 3 engages therewith from below when the container W is transferred to the support platform 3 as shown in FIG. 2. Then, if the container W is horizontally shifted relative to a proper support position of the support platform 3 when the support mechanism 24 supporting the flange portion 6 is moved down to transfer the container W to the support platform 3, the positioning members 9 come into contact with the inner surface of the bottom recesses 7 to move the container W horizontally. In this way, the horizontal position of the container W is corrected to the proper support position of the support platform 3.

As shown in FIG. 5, a downwardly recessed, cone-shaped top recess 8 is formed on the top surface of the flange portion 6 (the top surface of the container W). The top recess 8 is formed in a downwardly tapered shape. Also, the inner surface of the top recess 8 is formed as an inclined surface.

The top recess 8 is configured to engage with a pressing portion 24c of the support mechanism 24 from above when the support mechanism 24 is moved down as shown in FIG. 3. Then, if the support mechanism 24 is horizontally shifted relative to the container W placed and supported on the support platform 3 when the ceiling guided vehicle 1 moves the support mechanism 24 down, the pressing portion 24c comes into contact with and is guided by the inner surface of the top recess 8. In this way, the horizontal position of the support mechanism 24 is guided to a suitable position relative to the container W.

Ceiling Guided Vehicle

As shown in FIG. 5, the ceiling guided vehicle 1 includes a traveling portion 22 capable of traveling along the traveling path L provided above the support platform 3, and a container supporting portion 23 that is suspended and supported by the traveling portion 22 so as to be located below a traveling rail 21 and includes the support mechanism 24 that supports the container W.

The traveling portion 22 includes traveling wheels 22a that roll on the traveling rail 21 installed along the traveling path L, and a traveling motor 22b that rotationally drives the traveling wheels 22a. The traveling portion 22 is configured to travel along the traveling path L by rotationally driving the traveling wheels 22a by the driving of the traveling motor 22b.

The container supporting portion 23 includes the support mechanism 24 that suspends and supports the container W, an elevation driving portion 25 that moves the support mechanism 24 up and down relative to the traveling portion 22, a slidable driving portion 26 that slidably moves the support mechanism 24 in the lateral direction relative to the traveling portion 22, a rotational driving portion 27 that rotates the support mechanism 24 relative to the traveling portion 22 about the longitudinal axis, and a cover member 28 that covers the upper side and the path front and rear sides of the container W supported by the support mechanism 24 that has been raised to a raising set position (the position shown in FIG. 2, etc.).

The slidable driving portion 26 includes a relay portion 26a supported so as to be slidably movable relative to the traveling portion 22 along the lateral direction, and a sliding motor 26b (see FIG. 6) that slidably moves the relay portion 26a along the lateral direction. The slidable driving portion 26 is configured to move the support mechanism 24 and the elevation driving portion 25 along the lateral direction by slidably moving the relay portion 26a along the lateral direction by the driving of the sliding motor 26b.

The rotational driving portion 27 includes a rotational portion 27a supported so as to be rotatable relative to the relay portion 26a about the longitudinal axis, and a rotating motor 27b (see FIG. 6) that rotates the rotational portion 27a about the longitudinal axis. The rotational driving portion 27 is configured to rotate the support mechanism 24 and the elevation driving portion 25 about the longitudinal axis by rotating the rotational portion 27a by the driving of the rotating motor 27b.

The elevation driving portion 25 includes a winding member 25a supported by the rotational portion 27a, a take-up belt 25b that is wound on the winding member 25a and to which the support mechanism 24 is connected and supported at a distal end portion thereof, and an elevating motor 25c (see FIG. 6) that rotationally drives the winding member 25a. The elevation driving portion 25 is configured to move up and down the support mechanism 24 and the container W supported thereby by rotationally driving the winding member 25a in the forward or backward direction with the elevating motor 25c so as to take up or let out the take-up belt 25b. In this way, the elevation driving portion 25 is configured to raise and lower the support mechanism 24 relative to the traveling portion 22.

The support mechanism 24 includes a pair of gripping claws 24a and a gripping motor 24b (see FIG. 6) that moves each of the pair of gripping claws 24a toward or away from the other in the horizontal direction. Then, the support mechanism 24 moves the pair of gripping claws 24a toward each other with the gripping motor 24b, thereby achieving a supported state in which the pair of gripping claws 24a support the flange portion 6 of the container W. Also, the support mechanism 24 moves the pair of gripping claws 24a away from each other with the gripping motor 24b, thereby achieving a support release state in which the support to the flange portion 6 of the container W with the pair of gripping claws 24a is released. In this way, the support mechanism 24 is configured to be switchable between the supported state and the support release state.

Each of the pair of gripping claws 24a is formed in an L-shape in side view so as to support the flange portion 6 at its lower end portion from below. The pair of gripping claws 24a correspond to a lower support member that supports the container W from below. In this way, the support mechanism 24 is configured to be supported by the traveling portion 22 so as to be capable of being raised and lowered and to suspend and support the container W. The support mechanism 24 corresponds to the supporting portion that is supported by the traveling portion 22 and suspends and supports the container W.

Figure 6:
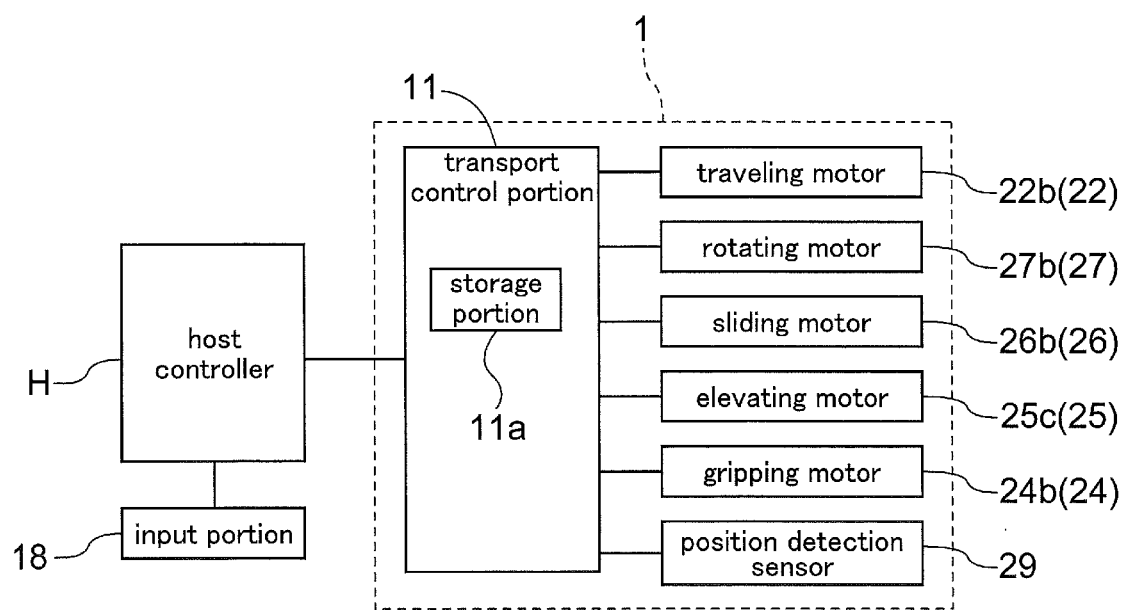
FIG. 6 is a control block diagram according to the first embodiment.

As shown in FIG. 6, the ceiling guided vehicle 1 includes a transport control portion 11 that controls the operation of the ceiling guided vehicle 1 by controlling the operation of various driving portions included in the ceiling guided vehicle 1. The transport control portion 11 corresponds to the control device.

Also, as shown in FIG. 5, the article transport facility includes a position detection sensor 29 for detecting the position of the detection target object 12 included in the inspection platform 4. In the present embodiment, the position detection sensor 29 corresponds to the position detection device. The support mechanism 24 of the ceiling guided vehicle 1 is configured to be capable of supporting the position detection sensor 29. The position detection sensor 29 is supported by the support mechanism 24 without interfering with the container W supported by the support mechanism 24. The position detection sensor 29 is supported by the support mechanism 24 so as to be further located above the flange portion 6 constituting the upper end portion of the container W suspended and supported by the support mechanism 24. Accordingly, the position detection sensor 29 can also be supported by the support mechanism 24 when the container W is transported by the ceiling guided vehicle 1, thus allowing the position detection sensor 29 to be constantly supported by the support mechanism 24.

The detection target object 12 includes a two-dimensional code. The position detection sensor 29 includes a two-dimensional image sensor. The transport control portion 11 determines the offset amount of the detection target object 12 relative to the position detection sensor 29 in the distance in the vertical direction and the offset amount thereof in the traveling direction, the width direction, and about the vertical axis of the detection target object 12 relative to the position detection sensor 29, based on the size, angle, position and the like of the detection target object 12 imaged by the position detection sensor 29.

A transporting target position and a transporting movement position are preset for each of a plurality of support platforms 3. The transporting target position is a target position at which the traveling portion 22 is stopped when the ceiling guided vehicle 1 transfers the container W to and from the support platform 3. The transporting movement position is a target position at which the support mechanism 24 is moved (raised/lowered, rotated, or slid) relative to the traveling portion 22 when the ceiling guided vehicle 1 transfers the container W to and from the support platform 3.

Also, an updating target position and an updating movement position are preset for the inspection platform 4. The updating target position is a target position at which the traveling portion 22 is stopped when the ceiling guided vehicle 1 detects the detection target object 12 of the inspection platform 4 with the position detection sensor 29. The updating movement position is a target position at which the support mechanism 24 is moved (raised/lowered, rotated, or slid) relative to the traveling portion 22 when the ceiling guided vehicle 1 detects the detection target object 12 of the inspection platform 4 with the position detection sensor 29.

The ceiling guided vehicle 1 includes a storage portion 11a in the transport control portion 11. Position information for stopping the traveling portion 22 is stored in the storage portion 11a. As such position information, transporting target position information representing the transporting target position, transporting movement position information representing the transporting movement position, updating target position information representing the updating target position, and updating movement position information representing the updating movement position are stored in the storage portion 11a.

Note that the transporting movement position and the updating movement position are defined by a rotation set position that defines the rotational position of the support mechanism 24 relative to the traveling portion 22 about the longitudinal axis, a lateral set position that defines the position of the support mechanism 24 relative to the traveling portion 22 in the lateral direction, and a lowering set position that defines the position of the support mechanism 24 relative to the traveling portion 22 in the vertical direction.

The position of the support mechanism 24 about the longitudinal axis when the traveling portion 22 travels is used as a rotation reference position, the position of the support mechanism 24 in the lateral direction when the traveling portion 22 travels is used as a lateral reference position, and the position of the support mechanism 24 in the vertical direction when the traveling portion 22 travels is used as a raising set position.

Then, a position at which the support mechanism 24 is located at the rotation reference position about the longitudinal axis, at the lateral reference position in the lateral direction, and at the raising set position in the vertical direction is used as a traveling position of the support mechanism 24. The traveling portion 22 travels in a state in which the support mechanism 24 is located at the traveling position.

Figure 7:
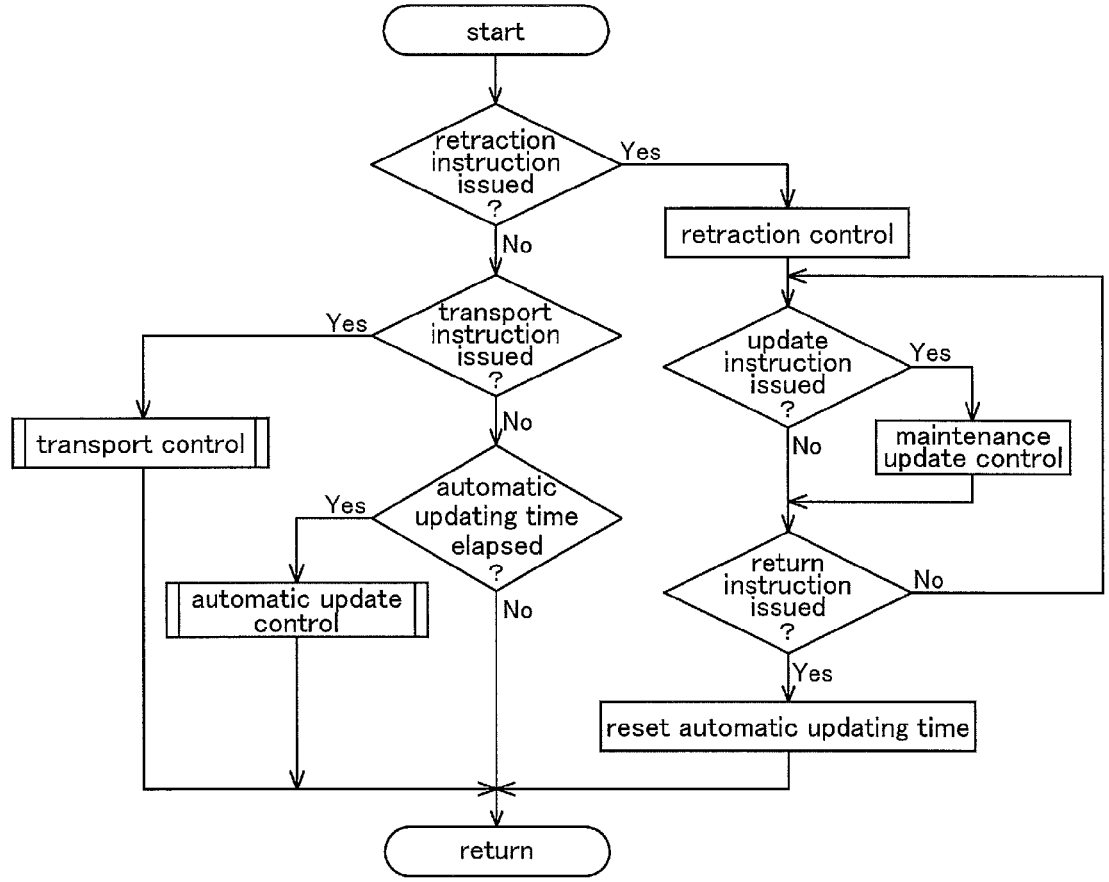
FIG. 7 is a flowchart of a control operation performed by a transport control portion according to the first embodiment.

As shown in FIG. 7, the transport control portion 11 is configured to control the operation of the traveling motor 22b so as to execute a retraction control in accordance with a retraction instruction from a host controller H installed on the ground side.

The retraction control is a control in which the operation of the traveling motor 22b is controlled so as to cause the traveling portion 22 to travel to the updating target position and to stop the traveling portion 22 at the updating target position, based on the updating target position information for the inspection platform 4. As a result of the transport control portion 11 executing the retraction control, the traveling portion 22 is stopped at the updating target position for the inspection platform 4.

As shown in FIG. 1, the updating target position is set in a location of the transport path that is away from the path along which the ceiling guided vehicle 1 travels when transporting the container W. The updating target position is set at such a position that even when a ceiling guided vehicle 1 is stopped at the updating target position, that ceiling guided vehicle 1 does not obstruct the transport of the container W by another ceiling guided vehicle 1.

The retraction instruction is issued to a ceiling guided vehicle 1 as the operation target as a result of an operation to instruct retraction being performed on the ceiling guided vehicle 1 as the operation target through an input operation to the input portion 18 performed by the operator during a maintenance operation, for example. A maintenance operation is an operation (periodic inspection operation) that is periodically performed for the purpose of maintenance of the article transport facility at an interval (e.g., one year) longer than a set period (e.g., 10 months) that is a preset period. The maintenance operation includes operations manually performed by the operator, such as adjusting the orientation of the position detection sensor 29 and replacing the traveling wheels 22a.

The host controller H is configured not to issue a transport instruction to a ceiling guided vehicle 1 designated as the operation target until the ceiling guided vehicle 1 is no longer the operation target (until a return instruction described below is issued). The host controller H may be configured to, when the retraction instruction is issued to a ceiling guided vehicle 1 as the operation target through an input operation to the input portion 18 performed by the operator, move the ceiling guided vehicle 1 to the updating target position for a lifter (not shown) installed to unload the ceiling guided vehicle 1 from the traveling rail 21, other than the updating target position for the inspection platform 4, depending on the content of the instruction.

The transport control portion 11 is configured to control the operation of the traveling motor 22b so as to execute the maintenance update control in accordance with a maintenance update instruction from the host controller H installed on the ground side. The maintenance update instruction corresponds to the update instruction.

The maintenance update control is a control in which the operation of the motors and the like included in the ceiling guided vehicle 1, such as the sliding motor 26b, and the position detection sensor 29 is controlled so as to move the support mechanism 24 to the updating movement position for the inspection platform 4 based on the updating movement position information for the inspection platform 4, subsequently operate the position detection sensor 29 to image the detection target object 12, and subsequently move the support mechanism 24 to the traveling position. As a result of the transport control portion 11 executing a measuring process, the detection target object 12 is imaged by the position detection sensor 29, and subsequently the support mechanism 24 is moved to the traveling position.

In the maintenance update control, a proper offset amount of the support mechanism 24 relative to the detection target object 12 in each of the traveling direction, the width direction, the rotational direction, and the vertical direction is calculated based on the imaging information resulting from imaging the detection target object 12 with the position detection sensor 29 as described above. Then, based on the offset amount, the transporting target position information, the transporting movement position information, the updating target position information, and the updating movement position information are updated such that the offset amount is reduced (preferably, eliminated). When the article transport facility includes a plurality of ceiling guided vehicles 1 as in the present embodiment, the transporting target position information, the transporting movement position information, the updating target position information, and the updating movement position information are updated for each individual ceiling guided vehicle 1.

Additionally, on the near side of each of the support platforms 3 and the inspection platform 4 in the traveling direction, a preliminary mark (not shown) for stopping is provided so as to be readable from a mark detection means (not shown) installed on the ceiling guided vehicle 1. The transporting target position for the support platform 3 and the updating target position for the inspection platform 4 are set such that the relative positions relative to the respective corresponding preliminary marks are the same. Accordingly, the transporting target position at each of the support platforms 3 can be brought closer to (preferably, made coincide with) a proper position by updating the updating target position information based on the offset amount measurement at the inspection platform 4, and updating the transporting target position information so as to correspond to the updated content of the updating target position information.

When a maintenance operation on the ceiling guided vehicle 1 as the operation target has ended, the operator performs, through the input portion 18, an input operation indicating that the maintenance operation for the ceiling guided vehicle 1 as the operation target has ended. Thereby, the host controller H cancels the setting for the ceiling guided vehicle 1 that has been the operation target. At this time, the host controller H issues a return instruction to return the ceiling guided vehicle 1 that has been the operation target to the transport control. Upon issuance of the return instruction, an automatic updating time is reset.

The transport control portion 11 is configured to control the operation of the motors and the like included in the ceiling guided vehicle 1 so as to execute the transport control in accordance with the transport instruction from the host controller H. The transport instruction is an instruction to transport the container W from a support platform 3 as the transport source to a support platform 3 as the transport destination.

Figure 8:
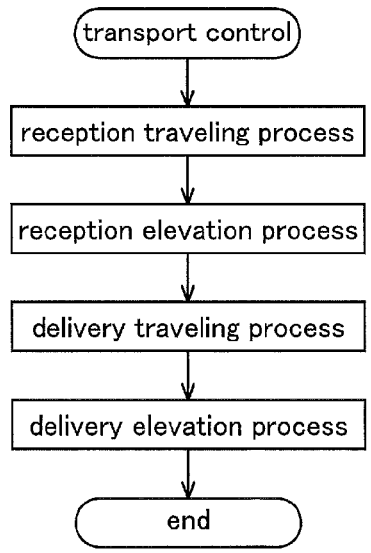
FIG. 8 is a flowchart of a transport control according to the first embodiment.

As shown in FIG. 8, the transport control is a control in which, when the transport instruction is issued, a container W is transported from a support platform 3 as the transport source to a support platform 3 as the transport destination by receiving the container W from the support platform 3 as the transport source and delivering the container W to the support platform 3 as the transport destination. In the transport control, a reception traveling process, a reception elevation process, a delivery traveling process, and a delivery elevation process are executed in this order.

The reception traveling process is a process in which the operation of the traveling motor 22b is controlled so as to cause the traveling portion 22 to travel to the transporting target position for the support platform 3 as the transport source and stopping the traveling portion 22 at the transporting target position, based on the transporting target position information for the support platform 3 as the transport source, which is designated as the transport source in the transport instruction. As a result of the transport control portion 11 executing the reception traveling process, the traveling portion 22 is stopped at the transporting target position for the support platform 3 as the transport source.

The reception elevation process is a process in which the operation of the motors and the like included in the ceiling guided vehicle 1, such as the sliding motor 26b, is controlled so as to move the support mechanism 24 to the transporting movement position for the support platform 3 as the transport source, subsequently move the gripping claws 24a to a close position, and subsequently move the support mechanism 24 to the traveling position, based on the transporting movement position information for the support platform 3 as the transport source. As a result of the transport control portion 11 executing the reception elevation process, the container W that has been supported by the support platform 3 as the transport source is supported by the support mechanism 24 and moved to the traveling position.

The delivery traveling process is a process in which the operation of the traveling motor 22b is controlled so as to cause the traveling portion 22 to travel to the transporting target position for the support platform 3 as the transport destination and stop the traveling portion 22 at the transporting target position, based on the transporting target position information for the support platform 3 as the transport destination, which is designated as the transport destination in the transport instruction. As a result of the transport control portion 11 executing the delivery traveling process, the traveling portion 22 is stopped at the transporting target position for the support platform 3 as the transport destination.

The delivery elevation process is a process in which the operation of the motors and the like included in the ceiling guided vehicle 1, such as the sliding motor 26b, is controlled so as to move the support mechanism 24 to the transporting movement position for the support platform 3 as the transport destination, subsequently move the gripping claws 24a to a spaced-apart position, and subsequently move the support mechanism 24 to the traveling position, based on the transporting movement position information for the support platform 3 as the transport destination. As a result of the transport control portion 11 executing the delivery elevation process, the container W that has been supported by the support mechanism 24 located at the traveling position is transferred to the support platform 3 as the transport destination.

The host controller H issues a transport instruction to a ceiling guided vehicle 1 as appropriate, regardless of whether or not the ceiling guided vehicle 1 is executing the transport control. When the next transport instruction is issued before the transport control ends, the transport control portion 11 executes the transport control in accordance with the next transport instruction after the transport control currently being executed has ended.

The transport control portion 11 of the present embodiment is configured to execute an automatic update control separately from a maintenance update control associated with a manual maintenance operation performed at an interval longer than a set period, in a cycle shorter than that of the maintenance update control. The automatic update control is executed on condition that the elapsed time since issuance of the maintenance update instruction has reached an automatic updating time (e.g., three months) that is a time shorter than the above-described set period (e.g., 10 months). As shown in FIG. 7, the transport control portion 11 starts the automatic update control after the transport control has ended if the next transport instruction has not been issued and the elapsed time since issuance of the most recent return instruction has reached the automatic updating time. In this way, the transport control portion 11 is configured to, after completing the transport control, start the automatic update control before issuance of the next transport instruction.

Figure 9:
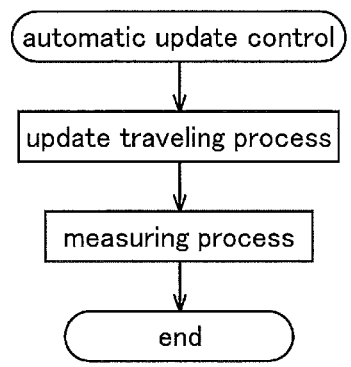
FIG. 9 is a flowchart of an automatic update control according to the first embodiment.

As shown in FIG. 9, an update traveling process and a measuring process are executed in the automatic update control. In the update traveling process, a process similar to the retraction control executed in the ceiling guided vehicle 1 as the operation target is executed. That is, in the update traveling process, the operation of the traveling motor 22b is controlled so as to cause the traveling portion 22 to travel to the updating target position and stop the traveling portion 22 at the updating target position, based on the updating target position information for the inspection platform 4. As a result of the transport control portion 11 executing the update traveling process, the traveling portion 22 is stopped at the updating target position for the inspection platform 4.

In the measuring process, a process similar to the maintenance update control executed in the ceiling guided vehicle 1 as the operation target is executed. That is, in the measuring process, the operation of the motors and the like such as the sliding motor 26b and the position detection sensor 29 that are included in the ceiling guided vehicle 1 is controlled so as to move the support mechanism 24 to the updating movement position for the inspection platform 4, subsequently operate the position detection sensor 29 to image the detection target object 12, and subsequently move the support mechanism 24 to the traveling position, based on the updating movement position information for the inspection platform 4. As a result of the transport control portion 11 executing the measuring process, the detection target object 12 included in the inspection platform 4 is imaged by the position detection sensor 29 supported by the support mechanism 24, and the transporting target position information, the transporting movement position information, the updating target position information, and the updating movement position information are updated.

The transport control including the delivery traveling process and the delivery elevation process correspond to the control in which, when the transport instruction is issued, the traveling portion 22 is stopped at the transporting target position based on the transporting target position information, and while the traveling portion is stopped, the supporting portion is raised and lowered to transfer the container W to the transport target location.

Each of the maintenance update control and the measuring process in the automatic update control corresponds to the update control in which the position of the detection target object 12 is detected by the position detection sensor 29 in a state in which the traveling portion 22 is stopped at the updating target position based on the updating target position information, and the updating target position information and the transporting target position information stored in the storage portion 11a are updated based on detection information from the position detection sensor 29.

Then, the transport control portion 11 is configured to execute the update control (retraction control and maintenance update control) in accordance with the update instruction (retraction instruction and maintenance update instruction) issued through a manual operation performed by the operator during a maintenance operation, and execute the update control (automatic update control) on condition that the automatic updating time has elapsed since issuance of the update instruction (return instruction) issued through a manual operation performed by the operator during a maintenance operation.

Second Embodiment

Next, a second embodiment of an article transport facility will be described with reference to the drawings.

To describe the second embodiment, configurations different from those of the first embodiment will be mainly described, and the description of the configurations similar to those of the first embodiment shall be omitted.

Figure 10:
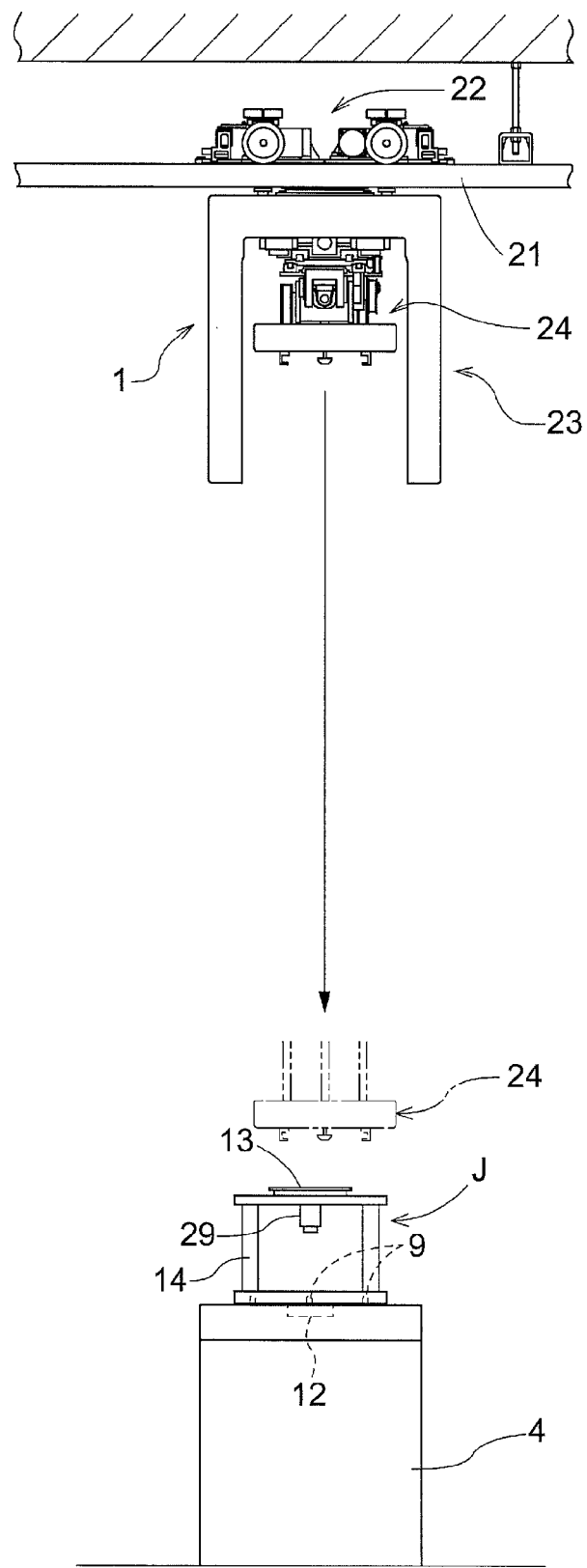
FIG. 10 is a side view showing a ceiling guided vehicle and an inspection platform according to a second embodiment.
Figure 11:
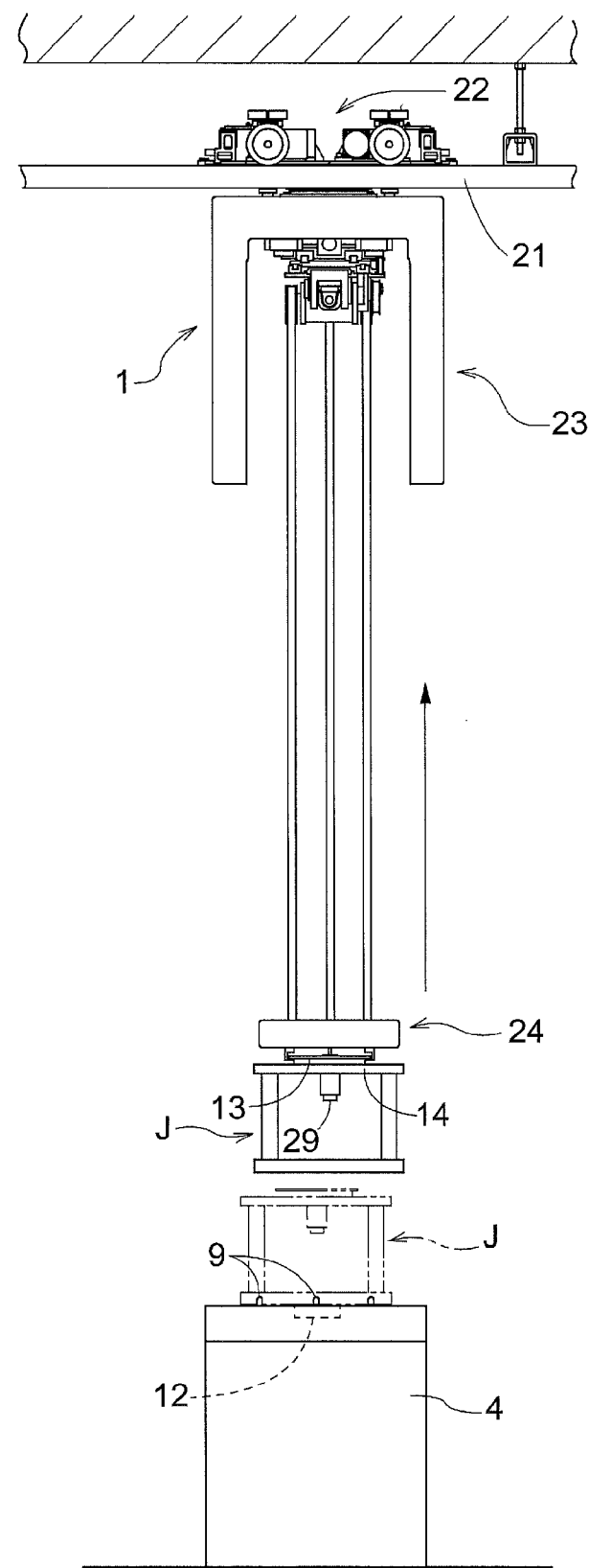
FIG. 11 is a side view showing the ceiling guided vehicle and the inspection platform according to the second embodiment.

As shown in FIGS. 10 and 11, the support mechanism 24 of the ceiling guided vehicle 1 is configured to be capable of supporting an inspection unit J in place of the container W.

The inspection unit J includes a unit flange portion 13 that is provided at the upper end portion of the inspection unit J and is supported by the support mechanism 24 of the ceiling guided vehicle 1, and a unit body portion 14 that is located below the unit flange portion 13 and supports the position detection sensor 29. The ceiling guided vehicle 1 is configured to transport the inspection unit J in a state in which the unit flange portion 13 is suspended and supported thereby.

The inspection unit J is placed on the inspection platform 4, and is supported by the inspection platform 4 so as to be retrievable. In this way, the inspection platform 4 serving as the position updating location is also used as the storage location in the present embodiment. Further, the storage target position that is the target position for the storage location is set at the same position as the updating target position.

As shown in FIG. 11, the ceiling guided vehicle 1 is configured to retrieve (lift) the inspection unit J from the storage location with the support mechanism 24 by raising and lowering the support mechanism 24 in a state in which the traveling portion 22 is stopped at the updating target position.

Three upwardly recessed, groove-shaped bottom recesses (not shown) are formed on the bottom surface of the unit body portion 14 (the bottom surface of the inspection unit J) as in the case of the container W. Accordingly, if the inspection unit J is horizontally shifted relative to the proper support position of the inspection platform 4 when the inspection unit J is transferred to the support platform 3, the positioning members 9 come into contact with the inner surfaces of the bottom recesses to move the inspection unit J horizontally. In this way, the horizontal position of the inspection unit J is corrected to the proper support position.

A downwardly recessed, cone-shaped top recess (not shown) is formed on the top surface of the unit flange portion 13 (the top surface of the inspection unit J). Accordingly, if the support mechanism 24 is horizontally shifted relative to the inspection unit J placed and supported on the inspection platform 4 when the ceiling guided vehicle 1 has moved the support mechanism 24 down, the pressing portion 24c comes into contact with and is guided by the inner surface of the above-described top recess. In this way, the horizontal position of the support mechanism 24 is guided to a suitable position relative to the inspection unit J.

Figure 12:
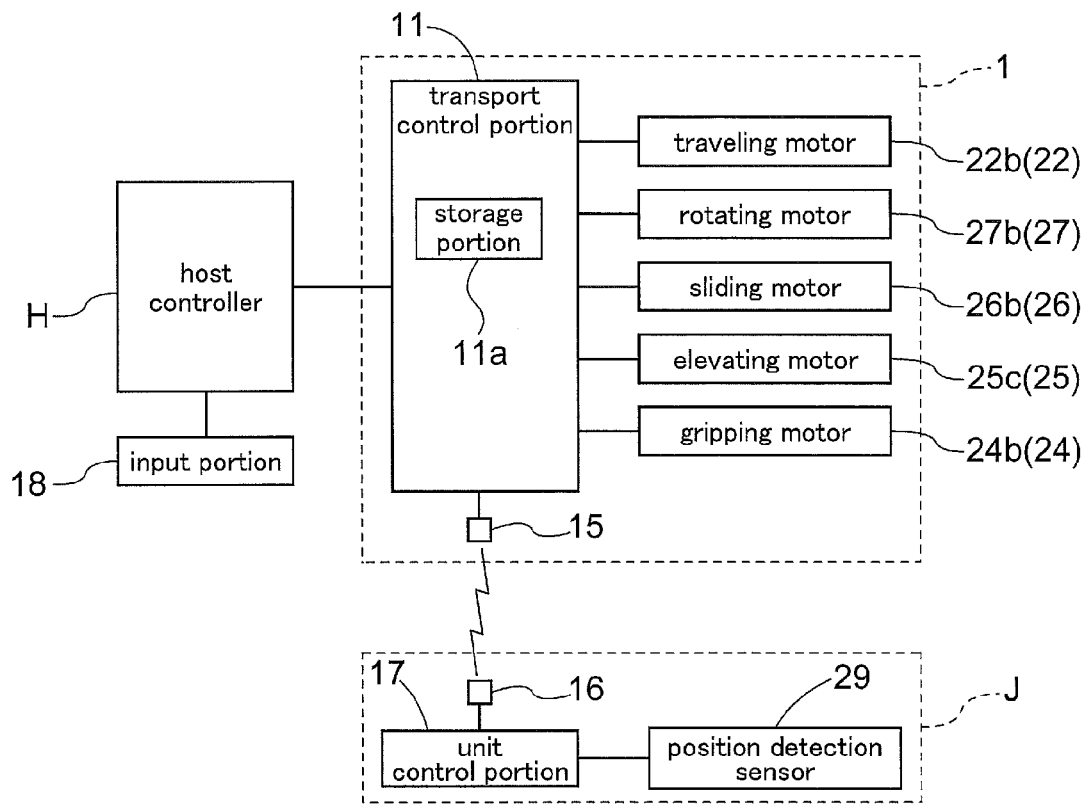
FIG. 12 is a control block diagram according to the second embodiment.

As shown in FIG. 12, the ceiling guided vehicle 1 includes a transport communication portion 15 for transmitting and receiving various types of information to and from a unit communication portion 16 of the inspection unit J via wireless communication. Also, the inspection unit J includes a position detection sensor 29 for detecting the position of the detection target object 12 included in the inspection platform 4, the unit communication portion 16 for transmitting and receiving various types of information to and from the ceiling guided vehicle 1 via wireless communication, and a unit control portion 17 that controls the operation of the position detection sensor 29 and the unit communication portion 16. In the present embodiment, the inspection unit J including the position detection sensor 29 corresponds to the position detection device.

After the transport control has ended, the automatic update control is executed when the elapsed time since issuance of the return instruction has reached the automatic updating time and the next transport instruction has not been issued.

Figure 13:
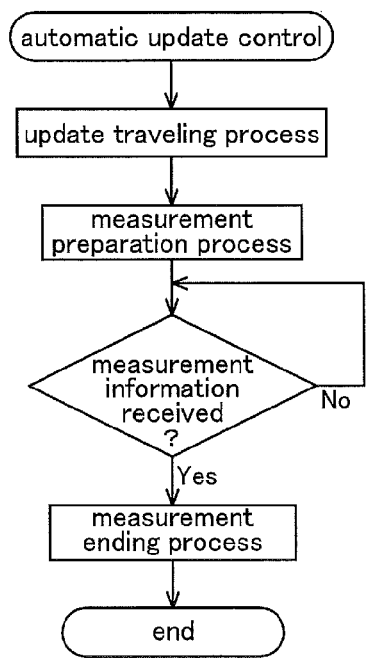
FIG. 13 is a flowchart of an automatic update control according to the second embodiment.

As shown in FIG. 13, in the second embodiment, a measurement preparation process and a measurement ending process are executed in the automatic update control, in place of the measuring process in the automatic update control described in the first embodiment.

The measurement preparation process is a process in which the operation of the motors and the like included in the ceiling guided vehicle 1, such as the sliding motor 26b, is controlled so as to move the support mechanism 24 to the updating movement position for the inspection platform 4 based on the updating movement position information for the inspection platform 4, subsequently move the gripping claws 24a to the close position, and subsequently move the support mechanism 24 to a measurement position. As a result of the transport control portion 11 executing the measurement preparation process, the inspection unit J supported on the inspection platform 4 is lifted to a set height by the support mechanism 24. In a state in which the measurement preparation process has been completed and the inspection unit J is lifted and supported by the support mechanism 24 in the above-described manner, a transmission process is executed, and preparation completion information is transmitted from the ceiling guided vehicle 1 toward the inspection unit J.

The measurement ending process is executed when the transport control portion 11 receives measurement information from the inspection unit J. The measurement ending process is a process in which the operation of the motors and the like included in the ceiling guided vehicle 1, such as the sliding motor 26b, is controlled so as to move the support mechanism 24 to the updating movement position, subsequently move the gripping claws 24a to the spaced-apart position, and subsequently move the support mechanism 24 to the traveling position. As a result of the transport control portion 11 executing the measurement ending process, the inspection unit J is transferred onto the inspection platform 4, and the support mechanism 24 is moved to the traveling position.

Further, in the measurement ending process, the transporting target position information, the transporting movement position information, the updating target position information, and the updating movement position information are updated based on offset amount information transmitted from the inspection unit J.

The measurement preparation process corresponds to the detection device retrieval control in which the traveling portion 22 is stopped at the updating target position (storage target position) based on the storage target position information, and the inspection unit J is retrieved by the support mechanism 24. The transmission process and the measurement ending process executed after execution of the measurement preparation process correspond to the update control.

Alternative Embodiments (1) In the embodiments described above, the transport control portion 11 is configured to start the update control when, after the transport control has ended, the next transport instruction has not been issued and the elapsed time since issuance of the most recent update instruction has reached the automatic updating time. However, the present invention is not limited to such a configuration, and the timing at which the automatic update control is started may be changed as appropriate.

Specifically, for example, when the elapsed time since issuance of the update instruction has reached the automatic updating time, the update control may be executed preferentially over the next transport instruction. It is also possible to adopt a configuration in which an updating travel distance is set as an assumed distance traveled by the article transport device during the course of the automatic updating time, and the update control is started when the travel distance of the article transport device after issuance of the update instruction has reached the updating travel distance.

The interval between maintenance operations may be longer than the set period, and the automatic updating time may be shorter than the set period. These set periods, the interval between maintenance operations, and the automatic updating time may be changed as appropriate.

(2) In the embodiments described above, various instructions such as the retraction instruction and the maintenance update instruction may be directly issued to the ceiling guided vehicle 1 by a remote controller or the like, and such information may be transmitted to the host controller H.

(3) In the embodiments described above, the transporting target position information, the transporting movement position information, the updating target position information, and the updating movement position information are updated by the update control. However, at least the transporting target position information and the updating target position information may be updated by the update control. For example, only some of the pieces of information representing the rotation set position, the lateral set position, and the lowering set position in each of the transporting movement position information and the updating movement position information may be updated. Also, at least one of the transporting movement position information and the updating movement position information need not be updated.

(4) In the second embodiment described above, the position updating location is also used as the storage location. However, the present invention is not limited to such a configuration, and the position updating location may be set in a location separate from the storage location.

(5) The configurations disclosed in each of the embodiments described above (including the above-described embodiment and alternative embodiments; the same applies to the following) are applicable in combination with configurations disclosed in other embodiments so long as no inconsistency arises. With regard to the other configurations as well, the embodiments disclosed herein are in all respects as illustrative, and appropriate changes and modifications may be made thereto without departing from the scope and sprit of the present disclosure.

Outline of the Embodiments

An article transport facility according to the present embodiment is an article transport facility including:

an article transport device that transports an article to a transport target location; and a control device that controls operation of the article transport device, the article transport device including: a traveling portion that travels along a traveling path; a supporting portion that is supported by the traveling portion and suspends and supports the article; an elevation driving portion that raises and lowers the supporting portion relative to the traveling portion in a state in which the traveling portion is stopped; and a storage portion that stores position information for stopping the traveling portion, wherein the article transport facility further includes a position detection device for detecting a position of a detection target object provided in a position updating location, the supporting portion is configured to be capable of supporting the position detection device, the storage portion stores, as the position information, transporting target position information representing a transporting target position that is a target position at which the traveling portion is stopped when the article transport device transfers the article to the transport target location, and updating target position information representing an updating target position that is a target position at which the traveling portion is stopped when the article transport device detects the detection target object with the position detection device, the control device is configured to execute a transport control and an update control, the transport control is a control in which, when a transport instruction to instruct transfer of the article to the transport target location is issued, the traveling portion is stopped at the transporting target position based on the transporting target position information, and while the traveling portion is stopped, the supporting portion is raised or lowered to transfer the article to the transport target location, the update control is a control in which a position of the detection target object is detected by the position detection device in a state in which the traveling portion is stopped at the updating target position based on the updating target position information, and the updating target position information and the transporting target position information that are stored in the storage portion are updated based on detection information from the position detection device, and the control device is configured to execute the update control in accordance with an update instruction issued through a manual operation performed by an operator during a maintenance operation performed at an interval longer than a set period that is a preset period, and to execute the update control on condition that an elapsed time since issuance of the update instruction has reached an automatic updating time that is a time shorter than the set period.

With this configuration, the control device executes the update control in which the position of the detection target object is detected by the position detection device in a state in which the traveling portion is stopped at the updating target position based on the updating target position information, and the updating target position information and the transporting target position information that are stored in the storage portion are updated based on detection information from the position detection device.

Since the transporting target position information is updated by using the position updating location that is set separately from the transport target location in this way, it is not necessary to install the detection target object in the transport target location in order to execute the update control. Accordingly, an article can be transported to the transport target location even during execution of the update control, and it is therefore possible to suppress a reduction in the article transport efficiency.

In addition to being executed in accordance with the update instruction issued through a manual operation performed by the operator during a maintenance operation performed at an interval longer than the set period, the update control is executed on condition that the elapsed time since issuance of the update instruction has reached the automatic updating time that is shorter than the set period. Also between execution of the update control associated with a maintenance operation and execution of the update control associated with the next maintenance operation, the update control is executed each time the automatic updating time has elapsed. By executing the update process also between execution of a maintenance operation and execution of the next maintenance operation in this way, it is possible to update the transporting target position information at an appropriate time before the article transport device becomes unable to transfer an article to the transport target location, without shortening the interval between maintenance operations.

Accordingly, it is possible to suppress a reduction in the article transport efficiency, while avoiding an increase in the operational burden on the operator and updating the transporting target position information at an appropriate time.

In an aspect, it is preferable that the position detection device is supported by the supporting portion without interfering with the article supported by the supporting portion.

With this configuration, the position detection device can be supported by the supporting portion not only when the supporting portion does not support an article, but also when the article transport device transports an article in a state in which the supporting portion supports the article. Accordingly, the position detection device can be constantly supported by the supporting portion. Since it is not necessary to perform the operation of attaching or removing the position detection device to and from the supporting portion before or after the control device executes the update control, it is possible to efficiently update the transporting target position information.

In an aspect, it is preferable that the position detection device is supported in the storage location so as to be retrievable, the article transport device is configured to retrieve the position detection device from the storage location by the supporting portion by raising and lowering the supporting portion in a state in which the traveling portion is stopped at a storage target position that is a target position for the storage location, the storage portion stores storage target position information representing the storage target position, and the control device executes, before execution of the update control, a detection device retrieval control in which the traveling portion is stopped at the storage target position based on the storage target position information, and the position detection device is retrieved by the supporting portion.

With this configuration, the position detection device is supported in the storage location so as to be retrievable, and therefore, even when a plurality of article transport devices are provided, the plurality of article transport devices can share the position detection device supported in the storage location. Accordingly, only one position detection device is needed even when a plurality of article transport devices are provided, and it is therefore possible to reduce the overall cost of the article transport facility.

In an aspect, it is preferable that the position updating location is also used as the storage location.

With this configuration, the position updating location is also used as the storage location, and it is therefore not necessary to reserve a storage location separately from the position updating location. Accordingly, it is possible to achieve space saving for the article transport facility. Furthermore, since the position detection device is supported in the position updating location where the detection target object is provided, the amount of movement of the position detection device for detecting the position of the detection target object with the position detection device can be reduced. Accordingly, it is possible to efficiently detect the position of the detection target object with the position detection device.

In an aspect, it is preferable that, after completing the transport control, the control device starts the update control before the next transport instruction is issued.

With this configuration, after completion of the transport control, the control device can execute the update control by using an idle time before execution of the transport control in accordance with the next transport instruction. Accordingly, it is possible to efficiently execute the update control.

A maintenance operation method of an article transport facility according to the present embodiment is a maintenance operation method of an article transport facility including:

an article transport device that transports an article to a transport target location; and a control device that controls operation of the article transport device, the article transport device including: a traveling portion that travels along a traveling path; a supporting portion that is supported by the traveling portion and suspends and supports the article; an elevation driving portion that raises and lowers the supporting portion relative to the traveling portion in a state in which the traveling portion is stopped; and a storage portion that stores position information for stopping the traveling portion, wherein the article transport facility further includes a position detection device for detecting a position of a detection target object provided in a position updating location, the supporting portion is configured to be capable of supporting the position detection device, the storage portion stores, as the position information, transporting target position information representing a transporting target position that is a target position at which the traveling portion is stopped when the article transport device transfers the article to the transport target location, and updating target position information representing an updating target position that is a target position at which the traveling portion is stopped when the article transport device detects the detection target object with the position detection device, the control device is configured to execute a transport control and an update control, the transport control is a control in which, when a transport instruction to instruct transfer of the article to the transport target location is issued, the traveling portion is stopped at the transporting target position based on the transporting target position information, and while the traveling portion is stopped, the supporting portion is raised or lowered to transfer the article to the transport target location, the update control is a control in which a position of the detection target object is detected by the position detection device in a state in which the traveling portion is stopped at the updating target position based on the updating target position information, and the updating target position information and the transporting target position information that are stored in the storage portion are updated based on detection information from the position detection device, and the control device executes the update control in accordance with an update instruction issued through a manual operation performed by an operator during a maintenance operation performed at an interval longer than a set period that is a preset period, and executes the update control on condition that an elapsed time since issuance of the update instruction has reached an automatic updating time that is a time shorter than the set period.

With this configuration, the control device executes the update control in which the position of the detection target object is detected by the position detection device in a state in which the traveling portion is stopped at the updating target position based on the updating target position information, and the updating target position information and the transporting target position information that are stored in the storage portion are updated based on detection information from the position detection device.

Since the transporting target position information is updated by using the position updating location that is set separately from the transport target location in this way, it is not necessary to install the detection target object in the transport target location in order to execute the update control. Accordingly, an article can be transported to the transport target location even during execution of the update control, and it is therefore possible to suppress a reduction in the article transport efficiency.

In addition to being executed in accordance with the update instruction issued through a manual operation performed by the operator during a maintenance operation performed at an interval longer than the set period, the update control is executed on condition that the elapsed time since issuance of the update instruction has reached the automatic updating time that is shorter than the set period. Also between execution of the update control associated with a maintenance operation and execution of the update control associated with the next maintenance operation, the update control is executed each time the automatic updating time has elapsed. By executing the update process also between execution of a maintenance operation and execution of the next maintenance operation in this way, it is possible to update the transporting target position information at an appropriate time before the article transport device becomes unable to transfer an article to the transport target location, without shortening the interval between maintenance operations.

Accordingly, it is possible to suppress a reduction in the article transport efficiency, while avoiding an increase in the operational burden on the operator and updating the transporting target position information at an appropriate time.

Note that the preferred configurations described above with regard to the article transport facility may also be incorporated as appropriate into the maintenance operation method of an article transport facility.

The invention claimed is:

1. An article transport facility comprising:
an article transport device that transports an article to a transport target location; and a control device that controls operation of the article transport device,
the article transport device including:
a traveling portion that travels along a traveling path;
a supporting portion that is supported by the traveling portion and suspends and supports the article;
an elevation driving portion that raises and lowers the supporting portion relative to the traveling portion in a state in which the traveling portion is stopped; and
a storage portion that stores position information for stopping the traveling portion,
wherein the article transport facility further comprises a position detection device for detecting a position of a detection target object provided in a position updating location,
the supporting portion is configured to be capable of supporting the position detection device,
the storage portion stores, as the position information, transporting target position information representing a transporting target position that is a target position at which the traveling portion is stopped when the article transport device transfers the article to the transport target location, and updating target position information representing an updating target position that is a target position at which the traveling portion is stopped when the article transport device detects the detection target object with the position detection device,
the control device is configured to execute a transport control and an update control,
the transport control is a control in which, when a transport instruction to instruct transfer of the article to the transport target location is issued, the traveling portion is stopped at the transporting target position based on the transporting target position information, and while the traveling portion is stopped, the supporting portion is raised or lowered to transfer the article to the transport target location,
the update control is a control in which a position of the detection target object is detected by the position detection device in a state in which the traveling portion is stopped at the updating target position based on the updating target position information, and the updating target position information and the transporting target position information that are stored in the storage portion are updated based on detection information from the position detection device, and
the control device is configured to execute the update control in accordance with an update instruction issued through a manual operation performed by an operator during a maintenance operation performed at an interval longer than a set period that is a preset period, and to execute the update control on condition that an elapsed time since issuance of the update instruction has reached an automatic updating time that is a time shorter than the set period.

2. The article transport facility according to claim 1, wherein the position detection device is supported by the supporting portion without interfering with the article supported by the supporting portion.

3. The article transport facility according to claim 1, wherein:
the position detection device is supported in the storage location so as to be retrievable,
the article transport device is configured to retrieve the position detection device from the storage location by the supporting portion by raising and lowering the supporting portion in a state in which the traveling portion is stopped at a storage target position that is a target position for the storage location,
the storage portion stores storage target position information representing the storage target position, and
the control device executes, before execution of the update control, a detection device retrieval control in which the traveling portion is stopped at the storage target position based on the storage target position information, and the position detection device is retrieved by the supporting portion.

4. The article transport facility according to claim 3, wherein the position updating location is also used as the storage location.

5. The article transport facility according to claim 1, wherein, after completing the transport control, the control device starts the update control before the next transport instruction is issued.

6. A maintenance operation method of an article transport facility comprising:
an article transport device that transports an article to a transport target location; and a control device that controls operation of the article transport device,
the article transport device including:
a traveling portion that travels along a traveling path;

a supporting portion that is supported by the traveling portion and suspends and supports the article;

an elevation driving portion that raises and lowers the supporting portion relative to the traveling portion in a state in which the traveling portion is stopped; and a storage portion that stores position information for stopping the traveling portion, wherein the article transport facility further comprises a position detection device for detecting a position of a detection target object provided in a position updating location, the supporting portion is configured to be capable of supporting the position detection device, the storage portion stores, as the position information, transporting target position information representing a transporting target position that is a target position at which the traveling portion is stopped when the article transport device transfers the article to the transport target location, and updating target position information representing an updating target position that is a target position at which the traveling portion is stopped when the article transport device detects the detection target object with the position detection device, the control device is configured to execute a transport control and an update control, the transport control is a control in which, when a transport instruction to instruct transfer of the article to the transport target location is issued, the traveling portion is stopped at the transporting target position based on the transporting target position information, and while the traveling portion is stopped, the supporting portion is raised or lowered to transfer the article to the transport target location, the update control is a control in which a position of the detection target object is detected by the position detection device in a state in which the traveling portion is stopped at the updating target position based on the updating target position information, and the updating target position information and the transporting target position information that are stored in the storage portion are updated based on detection information from the position detection device, and the control device executes the update control in accordance with an update instruction issued through a manual operation performed by an operator during a maintenance operation performed at an interval longer than a set period that is a preset period, and executes the update control on condition that an elapsed time since issuance of the update instruction has reached an automatic updating time that is a time shorter than the set period.

\* \* \* \* \*